US006899804B2

(12) United States Patent
Duboust et al.

(10) Patent No.: US 6,899,804 B2
(45) Date of Patent: May 31, 2005

(54) ELECTROLYTE COMPOSITION AND TREATMENT FOR ELECTROLYTIC CHEMICAL MECHANICAL POLISHING

(75) Inventors: Alain Duboust, Sunnyvale, CA (US); Lizhong Sun, San Jose, CA (US); Feng Q. Liu, Cupertino, CA (US); Yuchun Wang, San Jose, CA (US); Yan Wang, Sunnyvale, CA (US); Siew Neo, Santa Clara, CA (US); Liang-Yuh Chen, Foster City, CA (US)

(73) Assignee: Applied Materials, Inc., Santa Clara, CA (US)

(*) Notice: Subject to any disclaimer, the term of this patent is extended or adjusted under 35 U.S.C. 154(b) by 46 days.

(21) Appl. No.: 10/032,275

(22) Filed: Dec. 21, 2001

(65) Prior Publication Data

US 2003/0116446 A1 Jun. 26, 2003

(30) Foreign Application Priority Data

Apr. 10, 2001 (CN) .......................................... 090108587

(51) Int. Cl.$^7$ ................................................ C25F 3/00
(52) U.S. Cl. ..................... 205/650; 205/668; 205/674
(58) Field of Search ................................ 205/674, 650, 205/668

(56) References Cited

U.S. PATENT DOCUMENTS

| | | | |
|---|---|---|---|
| 2,582,020 A | 1/1952 | Emery ..................... | 204/140.5 |
| 3,239,441 A | 3/1966 | Marosi ..................... | 204/143 |
| 3,873,512 A | 3/1975 | Latanision ................ | 204/129.46 |
| 4,263,113 A | 4/1981 | Bernard .................... | 204/146 |
| 4,663,005 A | 5/1987 | Edson ....................... | 204/129.85 |
| 4,666,683 A | 5/1987 | Brown et al. ............. | 423/24 |
| 4,793,895 A | 12/1988 | Kaanta et al. ............ | 156/627 |

(Continued)

FOREIGN PATENT DOCUMENTS

| | | | |
|---|---|---|---|
| EP | 0 527 537 A1 | 2/1993 | .......... C01B/15/08 |
| EP | 0 699 782 A1 | 3/1996 | |
| EP | 0 811 665 | 12/1997 | |
| EP | 0 846 842 A2 | 6/1998 | |
| EP | 1 103 346 | 5/2001 | |
| EP | 1 167 585 A2 | 1/2002 | |
| EP | 1 170 761 A1 | 9/2002 | |
| JP | P2001-77117 A | 3/2001 | |
| SU | 1 618 538 A1 | 1/1991 | |
| WO | 98/04646 | 2/1998 | |
| WO | 98/49723 | 11/1998 | |

(Continued)

OTHER PUBLICATIONS

D. Landolt, "Fundamental Aspects of Electropolishing," Mar. 18, 1996, pp. 1–11.

PCT Written Opinion for PCT/US02/04806, dated Mar. 9, 2004 (AMAT/5699.PC).

(Continued)

*Primary Examiner*—Patrick Ryan
*Assistant Examiner*—Thomas H. Parsons
(74) *Attorney, Agent, or Firm*—Moser, Patterson & Sheridan

(57) ABSTRACT

An electrolyte composition and method for planarizing a surface of a wafer using the electrolyte composition is provided. In one aspect, the electrolyte composition includes ammonium dihydrogen phosphate, diammonium hydrogen phosphate, or a mixture thereof. The composition has a pH between about 3 and about 10 which is environmentally friendly and does not present hazardous operation concerns. The composition may further comprise one or more additives selected from a group consisting of benzotriazole, ammonium citrate, ethlylenediamine, tetraethylenepentamine, triethylenetetramine, diethylenetriamine, amino acids, ammonium oxalate, ammonia, ammonium succinate, and citric acid.

37 Claims, 1 Drawing Sheet

U.S. PATENT DOCUMENTS

| | | | | |
|---|---|---|---|---|
| 4,934,102 | A | 6/1990 | Leach et al. | 51/50 R |
| 4,992,135 | A | 2/1991 | Doan | 156/636 |
| 5,002,645 | A | 3/1991 | Eastland, Jr. et al. | 204/157.2 |
| 5,096,550 | A | 3/1992 | Mayer et al. | 204/129.1 |
| 5,114,548 | A | 5/1992 | Rhoades | 204/129.46 |
| 5,129,981 | A | 7/1992 | Wang et al. | 156/628 |
| 5,209,816 | A | 5/1993 | Yu et al. | 156/636 |
| 5,217,586 | A | 6/1993 | Datta et al. | 204/129.6 |
| 5,225,034 | A | 7/1993 | Yu et al. | 156/636 |
| 5,256,565 | A | 10/1993 | Bernhardt et al. | 437/228 |
| 5,340,370 | A | 8/1994 | Cadien et al. | 51/308 |
| 5,391,258 | A | 2/1995 | Brancaleoni et al. | 156/636 |
| 5,407,526 | A | 4/1995 | Danielson et al. | 156/636 |
| 5,534,106 | A | 7/1996 | Cote et al. | 156/636.1 |
| 5,543,032 | A | 8/1996 | Datta et al. | 205/670 |
| 5,567,300 | A | 10/1996 | Datta et al. | 205/652 |
| 5,575,706 | A | 11/1996 | Tsai et al. | 451/41 |
| 5,770,095 | A | 6/1998 | Sasaki et al. | 216/38 |
| 5,783,489 | A | 7/1998 | Kaufman et al. | 438/692 |
| 5,800,577 | A | 9/1998 | Kido | 51/307 |
| 5,807,165 | A | 9/1998 | Uzoh et al. | 451/41 |
| 5,846,882 | A | 12/1998 | Birang | 438/692 |
| 5,866,031 | A | 2/1999 | Carpio et al. | 252/79.1 |
| 5,880,003 | A | 3/1999 | Hayashi | 438/405 |
| 5,897,375 | A | 4/1999 | Watts et al. | 438/693 |
| 5,911,619 | A | 6/1999 | Uzoh et al. | 451/5 |
| 5,954,997 | A | 9/1999 | Kaufman et al. | 252/79.1 |
| 5,965,036 | A | 10/1999 | Maki et al. | 216/106 |
| 6,001,730 | A | 12/1999 | Farkas et al. | 438/627 |
| 6,004,880 | A | 12/1999 | Liu et al. | 438/692 |
| 6,056,864 | A | 5/2000 | Cheung | 205/222 |
| 6,063,306 | A | 5/2000 | Kaufman et al. | 252/79.4 |
| 6,066,030 | A | 5/2000 | Uzoh | 451/41 |
| 6,068,879 | A | 5/2000 | Pasch | 427/97 |
| 6,077,412 | A | 6/2000 | Ting et al. | 205/143 |
| 6,083,840 | A | 7/2000 | Mravic et al. | 438/693 |
| 6,090,239 | A | 7/2000 | Liu et al. | 156/345 |
| 6,096,652 | A | 8/2000 | Watts et al. | 438/692 |
| 6,099,604 | A | 8/2000 | Sandhu et al. | 51/307 |
| 6,103,096 | A | 8/2000 | Datta et al. | 205/686 |
| 6,106,728 | A * | 8/2000 | Iida et al. | 210/743 |
| 6,117,775 | A | 9/2000 | Kondo et al. | 438/690 |
| 6,117,783 | A | 9/2000 | Small et al. | 438/693 |
| 6,117,853 | A | 9/2000 | Sakai et al. | 514/78 |
| 6,121,152 | A * | 9/2000 | Adams et al. | 438/697 |
| 6,126,853 | A | 10/2000 | Kaufman et al. | 252/79.1 |
| 6,139,763 | A | 10/2000 | Ina et al. | 216/89 |
| 6,143,155 | A | 11/2000 | Adams et al. | 205/87 |
| 6,143,656 | A | 11/2000 | Yang et al. | 438/687 |
| 6,153,043 | A | 11/2000 | Edelstein et al. | 156/345 |
| 6,171,352 | B1 | 1/2001 | Lee et al. | 51/307 |
| 6,176,992 | B1 | 1/2001 | Talieh | 205/87 |
| 6,177,026 | B1 | 1/2001 | Wang et al. | 252/79.1 |
| 6,190,237 | B1 | 2/2001 | Huynh et al. | 451/41 |
| 6,194,317 | B1 | 2/2001 | Kaisaki et al. | 438/692 |
| 6,206,756 | B1 | 3/2001 | Chopra et al. | 451/28 |
| 6,217,416 | B1 | 4/2001 | Kaufman et al. | 451/41 |
| 6,218,305 | B1 | 4/2001 | Hosali et al. | 438/691 |
| 6,234,870 | B1 | 5/2001 | Uzoh et al. | 451/8 |
| 6,238,592 | B1 | 5/2001 | Hardy et al. | 252/791 |
| 6,248,222 | B1 | 6/2001 | Wang | 204/297.09 |
| 6,258,711 | B1 | 7/2001 | Laursen | 438/633 |
| 6,258,721 | B1 | 7/2001 | Li et al. | 438/693 |
| 6,273,786 | B1 | 8/2001 | Chopra et al. | 451/28 |
| 6,276,996 | B1 | 8/2001 | Chopra | 451/41 |
| 6,280,598 | B1 * | 8/2001 | Barton et al. | 205/210 |
| 6,299,741 | B1 | 10/2001 | Sun et al. | 204/224 M |
| 6,303,049 | B1 | 10/2001 | Lee et al. | 252/79.1 |
| 6,303,551 | B1 | 10/2001 | Li et al. | 510/175 |
| 6,310,019 | B1 | 10/2001 | Kakizawa et al. | 510/175 |
| 6,315,803 | B1 | 11/2001 | Ina et al. | 51/307 |
| 6,315,883 | B1 | 11/2001 | Mayer et al. | 205/123 |
| 6,348,076 | B1 | 2/2002 | Canaperi et al. | 51/309 |
| 6,354,916 | B1 | 3/2002 | Uzoh et al. | 451/41 |
| 6,355,075 | B1 | 3/2002 | Ina et al. | 51/308 |
| 6,355,153 | B1 | 3/2002 | Uzoh et al. | 205/87 |
| 6,375,693 | B1 | 4/2002 | Cote et al. | 51/308 |
| 6,379,223 | B1 | 4/2002 | Sun et al. | 451/41 |
| 6,391,166 | B1 | 5/2002 | Wang | 204/224 R |
| 6,395,152 | B1 | 5/2002 | Wang | 204/224 M |
| 6,416,685 | B1 | 7/2002 | Zhang et al. | 252/79.1 |
| 6,419,554 | B1 | 7/2002 | Chopra et al. | 451/41 |
| 6,428,721 | B1 | 8/2002 | Ina et al. | 252/79.4 |
| 6,429,133 | B1 | 8/2002 | Chopra | 438/692 |
| 6,440,186 | B1 | 8/2002 | Sakai et al. | 51/308 |
| 6,440,295 | B1 | 8/2002 | Wang | 205/640 |
| 6,447,371 | B2 | 9/2002 | Brusic Kaufman et al. | 451/36 |
| 6,454,819 | B1 | 9/2002 | Yano et al. | 51/298 |
| 6,455,479 | B1 | 9/2002 | Sahbari | 510/175 |
| 6,508,952 | B1 | 1/2003 | Lee et al. | 252/79.1 |
| 6,551,935 | B1 | 4/2003 | Sinha et al. | 438/693 |
| 6,555,158 | B1 | 4/2003 | Yoshio et al. | 427/97 |
| 6,562,719 | B2 | 5/2003 | Kondo et al. | 438/691 |
| 6,565,619 | B1 | 5/2003 | Asano et al. | 51/308 |
| 6,569,349 | B1 | 5/2003 | Wang et al. | 252/79.1 |
| 6,579,153 | B2 | 6/2003 | Uchikura et al. | 451/41 |
| 6,592,742 | B2 | 7/2003 | Sun et al. | 205/651 |
| 6,593,239 | B2 | 7/2003 | Kaufman et al. | 438/692 |
| 6,596,638 | B1 | 7/2003 | Kondo et al. | 438/690 |
| 6,602,112 | B2 | 8/2003 | Tran et al. | 451/36 |
| 6,605,537 | B2 | 8/2003 | Bian et al. | 438/691 |
| 6,616,976 | B2 | 9/2003 | Montano et al. | 427/327 |
| 6,620,215 | B2 | 9/2003 | Li et al. | 51/298 |
| 6,653,242 | B1 | 11/2003 | Sun et al. | 438/738 |
| 6,676,484 | B2 | 1/2004 | Chopra | 451/7 |
| 6,679,928 | B2 | 1/2004 | Costas et al. | 51/307 |
| 6,679,929 | B2 | 1/2004 | Asano et al. | 51/308 |
| 6,693,036 | B1 | 2/2004 | Nogami et al. | 438/692 |
| 2001/0016469 | A1 | 8/2001 | Chopra | |
| 2001/0024878 | A1 | 9/2001 | Nakamura | 438/691 |
| 2001/0036746 | A1 | 11/2001 | Sato et al. | 438/745 |
| 2001/0042690 | A1 | 11/2001 | Talieh | 205/118 |
| 2002/0008036 | A1 | 1/2002 | Wang | |
| 2002/0016064 | A1 | 2/2002 | Komai et al. | |
| 2002/0016073 | A1 | 2/2002 | Kondo et al. | |
| 2002/0016272 | A1 | 2/2002 | Kakizawa et al. | |
| 2002/0040100 | A1 | 4/2002 | Kume et al. | |
| 2002/0070126 | A1 | 6/2002 | Sato et al. | |
| 2002/0072309 | A1 | 6/2002 | Sato et al. | |
| 2002/0074230 | A1 | 6/2002 | Basol | |
| 2002/0088709 | A1 | 7/2002 | Hongo et al. | |
| 2002/0096659 | A1 | 7/2002 | Sakai et al. | |
| 2002/0108861 | A1 | 8/2002 | Emesh et al. | |
| 2002/0130049 | A1 | 9/2002 | Chen et al. | |
| 2002/0139055 | A1 | 10/2002 | Asano et al. | |
| 2002/0160698 | A1 | 10/2002 | Sato et al. | |
| 2003/0073385 | A1 | 4/2003 | Ma et al. | |
| 2003/0079416 | A1 | 5/2003 | Ma et al. | |
| 2003/0083214 | A1 | 5/2003 | Kakizawa et al. | |
| 2003/0104762 | A1 | 6/2003 | Sato et al. | 451/9 |
| 2003/0113996 | A1 | 6/2003 | Nogami et al. | |
| 2003/0114004 | A1 | 6/2003 | Sato et al. | |
| 2003/0116445 | A1 | 6/2003 | Sun et al. | |
| 2003/0116446 | A1 | 6/2003 | Duboust et al. | |
| 2003/0136055 | A1 | 7/2003 | Li et al. | |
| 2003/0153184 | A1 | 8/2003 | Wang et al. | |
| 2003/0170091 | A1 | 9/2003 | Shomiar et al. | |

FOREIGN PATENT DOCUMENTS

| | | |
|---|---|---|
| WO | WO 99 46353 A1 | 9/1999 |
| WO | 99/53532 | 10/1999 |

| WO | 99/65072 | 12/1999 | ......... H01L/21/321 |
| --- | --- | --- | --- |
| WO | 00/26443 | 5/2000 | |
| WO | 00 55876 A1 | 9/2000 | |
| WO | 01/77241 | 10/2001 | |
| WO | WO 02 23616 A1 | 3/2002 | |
| WO | 02 075804 A2 | 9/2002 | |
| WO | WO 02 088229 A1 | 11/2002 | |
| WO | WO 03 060962 A2 | 7/2003 | |

OTHER PUBLICATIONS

PCT Written Opinion for PCT/US03/06058, dated Feb. 13, 2004 (AMAT/5699–PC.02).

PCT International Preliminary Examination Report for PCT/US02/04806, dated Sep. 7, 2004. (AMAT/5699.PC).

PCT International Preliminary Examination Report for PCT/US03/06058, dated Sep. 7, 2004. (AMAT/5699.PC.02).

PCT International Search Report for US 03/06058 dated Jun. 25, 2003.

International Search Report, dated Aug. 5, 2003 for PCT/US02/40754.

Nogami: *An Annovation to Integrate Porous Low–K Materials And Copper; InterConnect Japan 2001*; Honeywell Seminar Dec. 6, 2001; pp. 1–12.

International Search Report for PCT/US02/04806 dated Apr. 1, 2003.

Robert J. Contolini et al. "Electrochemical Planarization of ULSI Copper" Jun. 1997, Solid State Technology, pp. 155–156, 158, 160.

International Search Report for PCT/US02/40754 dated Apr. 28, 2003.

* cited by examiner

ELECTROLYTE COMPOSITION AND TREATMENT FOR ELECTROLYTIC CHEMICAL MECHANICAL POLISHING

BACKGROUND OF THE INVENTION

1. Field of the Invention

Embodiments of the present invention relate to electrolytic chemical mechanical polishing. More particularly, embodiments of the present invention relate to an electrolyte solution for copper removal and a method for removing copper ions therefrom.

2. Background of the Related Art

Reliably producing sub-half micron and smaller features is one of the key technologies for the next generation of very large scale integration (VLSI) and ultra large-scale integration (ULSI) of semiconductor devices. However, as the limits of circuit technology are pushed, the shrinking dimensions of interconnects in VLSI and ULSI technology have placed additional demands on the processing capabilities. Reliable formation of these interconnects is important to VLSI and ULSI success and to the continued effort to increase circuit density and quality of individual substrates and die.

Multilevel interconnects are formed using sequential material deposition and material removal techniques on a substrate surface to form features therein. As layers of materials are sequentially deposited and removed, the uppermost surface of the substrate may become non-planar across its surface and require planarization prior to further processing. Planarization or "polishing" is a process where material is removed from the surface of the substrate to form a generally even, planar surface. Planarization is useful in removing excess deposited material and removing undesired surface topography and surface defects, such as rough surfaces, agglomerated materials, crystal lattice damage, scratches, and contaminated layers or materials to provide an even surface for subsequent lithography and processing.

Electrochemical mechanical polishing (ECMP) is one method of planarizing a surface of a substrate. ECMP removes conductive materials from a substrate surface by electrochemical dissolution while polishing the substrate with a reduced mechanical abrasion compared to conventional chemical mechanical planarization (CMP) processes. A typical ECMP system includes a substrate support and two electrodes disposed within an electrolyte containment basin. In operation, metal atoms on a surface of a substrate are ionized by an electrical current from a source of potential, such as a battery or other voltage source connected to the two electrodes. The metal ions dissolve into the surrounding electrolyte solution at a rate proportional to the electric current. The metal ions from the substrate (anode) either plate the electrode (cathode), fall out of the solution as a precipitate, or remain in the solution. The destiny of the metal ions depends greatly on the chemistry of the metals and the solution.

One problem associated with ECMP techniques is safely handling the conventional electrolyte solution. A conventional electrolyte solution typically contains various performance enhancing additives and electrolytes. Common electrolytes contain strong acids having a pH less than or about 1.0, such as sulfuric acid and phosphoric acid, for example. These acidic electrolytes are corrosive and are difficult to handle safely.

Highly acidic electrolytes also interfere with additives of the electrolyte solution, thereby inhibiting or canceling the beneficial effects of the additive. In particular, metal ions from the substrate tend to chemically bond to the certain additives which alters the reactive or chemical characteristics of the additive. One common solution is to add more of the depleted additive. However, this approach is difficult to control or regulate in a continuous processing system. Additionally, the amount of additive to be added is difficult to quantify since the rate of depletion is dependent on several processing parameters that are difficult to monitor and quantify.

There is a need, therefore, for an electrolyte composition containing less hazardous components and less acidic components. There is also a need for a method of continously using an electrolyte composition.

SUMMARY OF THE INVENTION

An electrolyte composition and method for using the same is provided which can planarize copper electrochemically. The electrolyte composition has a pH of about 3 to about 10 and comprises a phosphate system. In one aspect, the phosphate system comprises ammonium dihydrogen phosphate, diammonium hydrogen phosphate, or a mixture thereof. The composition may further comprise one or more additives selected from the following group: suppressors, enhancers, levelers, inhibitors, brighteners, chelating agents, and stripping agents. More particularly, the one or more additives may include benzotriazole, ammonium citrate, ethlylenediamine, tetraethylenepentamine, triethylenetetramine, diethylenetriamine, amino acids, ammonium oxalate, ammonia, ammonium succinate, and citric acid.

In one aspect, a method for ECMP is provided which includes connecting a wafer to a positive terminal of an electrical power source, disposing the wafer in an electrolyte composition and removing materials from the surface of the wafer. The electrolyte composition may include ammonium dihydrogen phosphate, diammonium hydrogen phosphate, or a mixture thereof. The electrolyte composition may also include one or more additives selected from the following group: benzotriazole, ammonium citrate, ethlylenediamine, tetraethylenepentamine, triethylenetetramine, diethylenetriamine, amino acids, ammonium oxalate, ammonia, ammonium succinate, and citric acid. Preferably, the removed materials are copper ions.

In another aspect, the method further includes flowing the electrolyte composition through an ion exchange resin to remove the conductive ions from the solution, and recycling the electrolyte composition to the wafer. Preferably, the ion exchange resin comprises a chelating agent that is specific to copper atoms.

BRIEF DESCRIPTION OF THE DRAWING

So that the manner in which the above recited aspects of the invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and, therefore, are not to be considered limiting of its scope, for the invention may admit to other equally effective embodiments.

DETAILED DESCRIPTION OF THE PREFERRED EMBODIMENT

Figure 1:
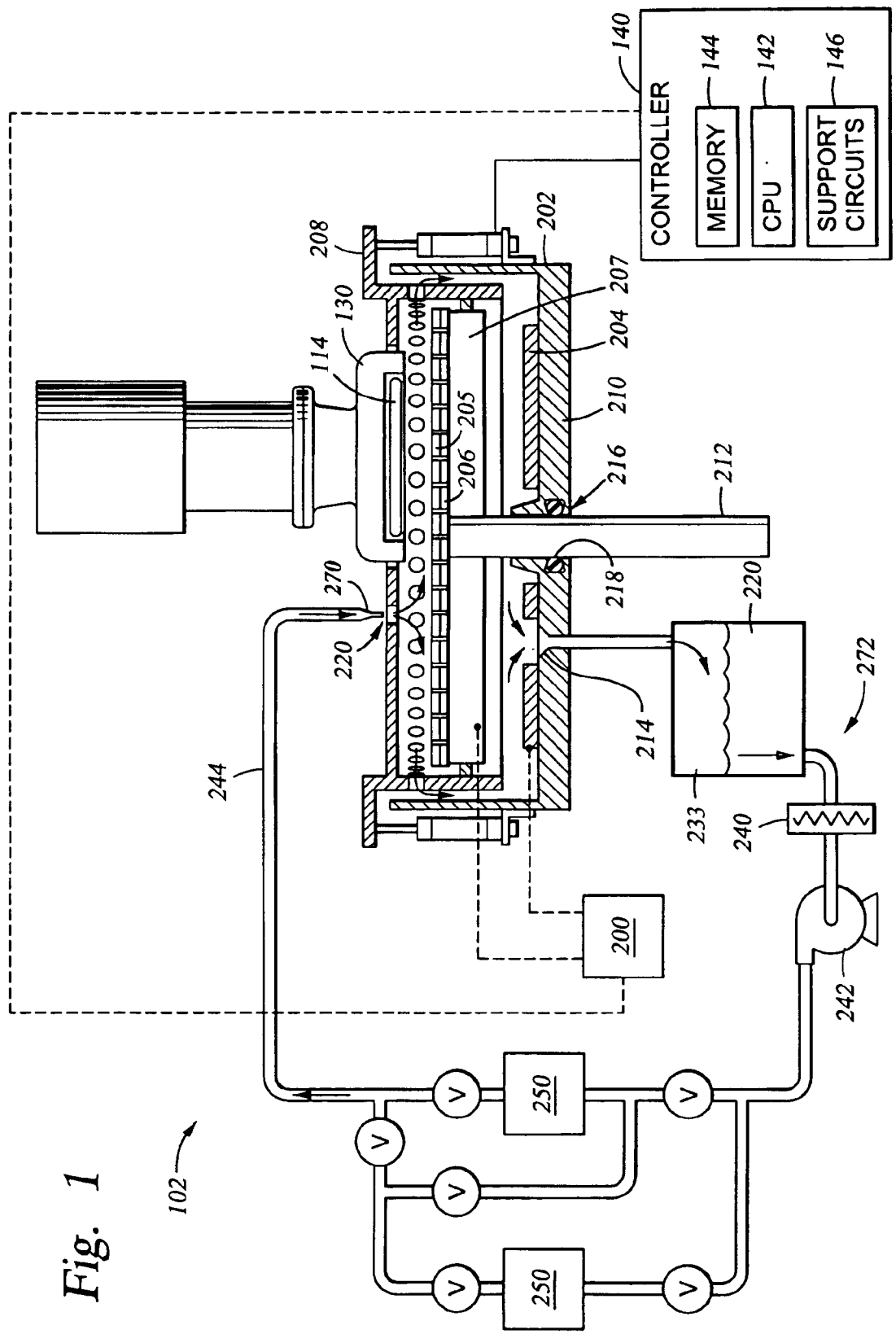
FIG. 1 is a partial section view of an POLISHING process station 102 useful for practicing the methods described herein.

The words and phrases used herein should be given their ordinary and customary meaning in the art by one skilled in the art unless otherwise further defined. Chemical polishing should be broadly construed and includes, but is not limited to, planarizing a substrate surface using chemical activity. Electropolishing should be broadly construed and includes, but is not limited to, planarizing a substrate by the application of electrochemical activity. Electrochemical mechanical polishing (ECMP) should be broadly construed and includes, but is not limited to, planarizing a substrate by the application of electrochemical activity, mechanical activity, or a combination of both electrochemical and mechanical activity to remove material from a substrate surface. Anodic dissolution should be broadly construed and includes, but is not limited to, the application of an anodic bias to a substrate directly or indirectly which results in the removal of conductive material from a substrate surface and into a surrounding electrolyte composition.

An electrolyte composition 220 that can planarize copper is provided. The electrolyte composition 220 has a pH of about 3 to about 10. Although the electrolyte composition 220 is particularly useful for removing copper, it is believed the electrolyte composition 220 also may be used for the removal of other conductive materials, such as aluminum, platinum, tungsten, titanium, gold, and silver, for example.

The electrolyte composition 220 is an aqueous solution and includes phosphate systems, derivatives thereof, and mixtures thereof. Preferably, the electrolyte composition 220 includes a phosphate system, such as ammonium dihydrogen phosphate ($NH_4H_2PO_4$), diammonium hydrogen phosphate (($NH_4)_2HPO_4$), phosphoric acid, or a mixture thereof, in amounts of about 2 to about 30 percent by weight in volume of total solution. In another aspect, the electrolyte composition 220 includes dihydrogen phosphate and/or diammonium hydrogen phosphate in amounts of about 15 to about 25 percent by weight in volume of total solution. In yet another aspect, the electrolyte composition 220 includes dihydrogen phosphate and/or diammonium hydrogen phosphate in an amount of about 20 percent by weight in volume of total solution.

The electrolyte composition 220 may also include a base compound such as potassium hydroxide (KOH) for example, to adjust the pH of the composition 220. The base compound may be added in quantities less than about 70 percent by weight in volume of total solution.

The electrolyte composition 220 may further include one or more additives that adsorb onto the surface of the substrate. Additives may include levelers, brighteners, inhibitors, suppressors, enhancers, and surfactants, for example. Certain additives may decrease the ionization rate of the metal atoms, thereby inhibiting the dissolution process, whereas other additives may increase the dissolution rate of the removed metal ions, thereby increasing the removal rate of the metal. Various additives may also provide a finished, shinny substrate surface.

The additives may be present in the electrolyte composition 220 in concentrations up to about 15% by weight in volume of total solution. Useful additives include one or more chelating agents having amine groups, amide groups, carboxylate groups, dicarboxylate groups, tri-carboxylate groups, or combinations thereof. For example, the chelating agents may include tetraethylenepentamine, triethylenetetramine, diethylenetriamine, ethlylenediamine, amino acids, ammonium oxalate, ammonia, ammonium citrate, citric acid, and ammonium succinate. The additives may also include organic compounds with azole groups such as benzotriazole (BTA), for example.

In one aspect, BTA is added to the electrolyte composition 220 in amounts of about 0.01 to about 2 percent by weight in volume of total solution, and ammonium citrate is added to the electrolyte solution in amounts of about 0.1 to about 15 percent by weight in volume of total solution. In another aspect, BTA is added in amounts of about 0.05 to about 0.5 percent by weight in volume of total solution, and ammonium citrate is added in amounts ranging from about 7 to about 10 percent by weight in volume of total solution. In yet another aspect, BTA is added to the electrolyte composition 220 in amounts of about 0.01 to about 2 percent by weight in volume of total solution, and ethylenediamine (EDA) is added to the electrolyte solution in amounts of about 2 to about 15 percent by weight in volume of total solution.

Although the electrolyte composition is thought to be useful with ECMP, electropolishing, and chemical polishing systems, the electrolyte composition may be used particularly to advantage in an ECMP process station. A typical ECMP process station is a modified cell on an Electra® Cu Integrated ECP system, available from Applied Materials, Inc. of Santa Clara, Calif. A typical ECMP process station may also be a modified platen on an Reflexion®/Mirra® Integrated CMP system, both available from Applied, Inc. of Santa Clara, Calif.

FIG. 1 illustrates a partial section view of a polishing station 102. As shown, the polishing station 102 generally includes a basin 202, a first electrode 204, a second electrode 207, a cover 208, and a polishing head 130. The polishing head 130 provides support for a wafer/substrate 114 disposed thereon. Although the polishing station 102 depicts a wafer "face down" configuration, the electrolyte composition 220 may also be used to advantage within a processing chamber utilizing a wafer "face up" configuration. In this alternative configuration, the wafer would rest with its plating side up and the pad would be disposed on the plating surface of the wafer.

Referring to FIG. 1, the first electrode 204 is disposed within the basin 202 and is a conventional electrode having a reactive bias applied thereto to act as a cathode. The first electrode 204 may be made of the metal to be removed from the substrate 114, which may consist of aluminum, copper, gold, silver, or tungsten, for example. Accordingly, for copper removal, the first electrode 204 consists of copper containing materials.

The second electrode 207 is also disposed within the basin 202 and may take the form of a polishing media 205 supported on a lower surface by a perforated disc 206. The polishing media 205 is used to apply a uniform bias to the substrate surface without the use of a conventional bias application apparatus, such as an edge contact. The polishing media 205 can be a pad, web, or belt of material that includes a partially conductive surface for contact with the substrate surface during processing. The partially conductive surface of the polishing media 205 may include materials, such as conductive polymers, polymer composites with conductive materials, conductive metals, conductive fillers, conductive doping materials, or combinations thereof. The partially conductive surface of the polishing media 205 may also be a composite of a conductive polishing material disposed in a conventional polishing material, such as a polymer-noble metal hybrid material like a platinum-polymer hybrid material. The partially conductive surface of the polishing media 205 is described in more detail in the co-pending provisional U.S. patent application, Ser. No. 60/286,107, entitled "Conductive Polishing Media For Electrochemical Mechanical Polishing", filed on Apr. 24, 2001, which is incorporated by reference herein.

The basin 202 can be a bowl shaped member made of a plastic such as fluoropolymers, TEFLON®, PFA, PE, PES, or other materials that are compatible with electroplating and electropolishing chemistries. The basin 202 has a bottom 210 that includes an aperture 216 and a drain 214. The aperture 216 is generally disposed in the center of the bottom 210 and allows a shaft 212 to pass there-through. A seal 218 is disposed between the aperture 216 and the shaft 212 and allows the shaft 212 to rotate while preventing fluids disposed in the basin 202 from passing through the aperture 216.

The electrolyte composition 220 is disposed in the basin 202 and generally flows through the drain 214 into a fluid recycle system 272. The fluid recycle system 272 includes a reservoir 233, filter 240, recycle pump 242, and one or more ion exchange systems 250. The electrolyte composition 220 flowing into the fluid recycle system 272 is collected in the reservoir 233. The pump 242 transfers the electrolyte composition 220 from the reservoir 233 through a supply line 244 to the nozzle 270 where the electrolyte composition 220 is recycled to the polishing station 102. The filter 240 may be disposed between the reservoir 233 and the nozzle 270 to remove particles and agglomerated material that may have collected in the electrolyte composition 220. Optionally, the filter 240 may be disposed between the pump 242 and the ion exchange system 250.

The one or more ion exchange systems 250 remove copper ions from the electrolyte composition 220 by a physical or chemical adsorption process. The ion exchange system 250 includes any ion exchange resin capable of capturing copper from the electrolyte composition 220 without affecting the electrolytic properties of the composition 220. The ion exchange resin preferably consists of an aminopyridine functionality on a polymer matrix resin. In one aspect, resins are those having a bispicolylamine functionality or an N-(2-hydroxypropyl) picolylamine functionality. For example, two such resins are commercially available under the trade names Dowex 4195 and Dowex XFS 43084 from the Dow Chemical Company located in Midland, Mich. The former has a bispicolylamine functionality and the latter has an N-(2-hydroxypropyl)picolylamine functionality.

The ion exchange resin has a strong affinity for copper ions. Thus, copper ions are removed from the electrolyte composition 220 as the composition 220 flows through the ion exchange system 250. After a period of use, the resin may be regenerated by flowing a regeneration fluid such as an aqueous solution of ammonium hydroxide or acid through the ion exchange system 250. In one aspect, the recycle system 272 includes at least two ion exchange systems 250 in series or parallel so that a first system 250 may be regenerated while a second system 250 remains in operation. This way, the deplating process can be operated continuously without interruption.

Although the ion exchange system 250 has been described above in reference to a phosphate electrolyte system containing copper ions, it is believed the resin exchange system 250 is useful for removing copper and any other metal ion from any wet composition, such as a sulfate composition like sulfuric acid and derivatives thereof. Likewise, it is believed the resin exchange system 250 is useful with any wet processing system for removing metal ions from solution. For example, it is believed the resin exchange system 250 is advantageous for recycling solutions adapted for chemical-mechanical polishing, chemical polishing, electropolishing, electrochemical deposition, electroless plating, and electroplating.

In addition to the ion exchange system 250, embodiments of the present invention may provide other methods for reducing the concentration of dissolved copper ions in the electrolyte composition 220. For example, the counter first electrode 204 may be negatively biased to reduce the copper ions from the electrolyte composition 220 during wafer transfer or idle mode. Further, the first electrode 204 may consist of platinum which releases hydrogen ions into the electrolyte solution 220. The dissociation of hydrogen ions reduces the amount of copper ions in the electrolyte solution 220. Still further, the second electrode 207 may be porous to provide an increased surface area for absorbing copper ions released into the electrolyte composition 220. This increased surface area promotes copper ion deposition to the second electrode 207, thereby reducing the concentration of the copper ions in solution.

Still referring to FIG. 1, a substrate 114 is disposed on the substrate support 130 which may be a polishing head used in a chemical mechanical planarization process as shown. The substrate support 130 typically applies a pressure in the range of about 0.1 psi to about 6 psi to the substrate surface to be electrochemically and mechanically polished. On the substrate support 130, the substrate 114 is exposed to the electrolyte composition 220 and contacted with the second electrode 207. A bias from a power source 200 is then applied to both electrodes 204 and 207. The bias typically ranges from about −15 volts to about 15 volts. In one aspect, the positive bias ranges from about 0.1 volts to about 10 volts and the negative bias ranges from about −0.1 to about −10 volts. Alternatively, the bias may be a current density between about 0.01 and about 40 milliamps/cm$^2$ for a 200 mm substrate. The bias may be varied in power and application depending upon the user requirements in removing material from the substrate surface. The bias may also be applied by an electrical pulse modulation technique, which applies a constant current density or voltage for a first time period, then applies a constant reverse current density or voltage for a second time period, and repeats the first and second steps, as is described in co-pending U.S patent application, Ser. No. 09/450,937, entitled "Method And Apparatus For Electrochemical Mechanical Planarization", filed on Nov. 29, 1999, now U.S. Pat. No. 6,379,223 which is incorporated by reference herein.

To facilitate control of the polishing process, a controller 140 comprising a central processing unit (CPU) 142, memory 144, and support circuits 146, is connected to the POLISHING station 102. The CPU 142 may be one of any form of computer processors that are used in industrial settings for controlling various drives and pressures. The memory 144 is connected to the CPU 142, and may be one or more of a readily available memory such as random access memory (RAM), read only memory (ROM), floppy disk, hard disk, or any other form of digital storage, local or remote. Software instructions and data can be coded and stored within the memory 144 for instructing the CPU 142. The support circuits 146 are also connected to the CPU 142 for supporting the processor 142 in a conventional manner. The support circuits 146 may include cache, power supplies, clock circuits, input/output circuitry, subsystems, and the like.

As the process proceeds, the electrolyte solution 220 is cycled through the fluid recycle system 272 to remove copper ions dissolved in the electrolyte solution 220. First, the electrolyte solution 220 flows through the drain 214 of the basin 202 to the reservoir 233. The pump 242 transfers the electrolyte solution 220 through the ion exchange system 250 and through the nozzle 270 for injection into the basin 202.

Various configurations of the ion exchange systems 250 may be employed. For example, two or more ion exchange systems 250 may be situated in parallel or series, depending on the needs and demands of the processing system. The exact nature of piping, valving, and pumps is well known to one skilled in the art of ion-exchange technology, and is determined by the volume of the electrolyte composition 220, the frequency of plating operations, the composition of the substrates, and the required purity of the electrolyte composition 220, for example.

Once the resin becomes saturated with bound copper ions, the copper ions are stripped from the resin using one or more stripping agents and water. Stripping agents, such as ammonium hydroxide ($NH_4OH$), sulfuric acid ($H_2SO_4$), EDTA (ethylenediaminetetraacetic acid), tetraethylenepentamine triethylenetetramine, diethylenetriamine, ethylenediamine, phenanthroline, and diethylenetriaminetetraacetic acid, have shown to effectively strip the adsorbed copper ions from the resin.

EXAMPLES

The following non-limiting examples are provided to further illustrate the advantages and embodiments of the invention. However, the examples are not intended to be all inclusive and are not intended to limit the scope of the invention described herein above.

Example 1

A copper plated wafer was polished using the following electrolyte solution within a modified cell on an Electra® Cu Integrated ECP system, available from Applied Materials, Inc. of Santa Clara, Calif.

BTA: about 0.4 percent by weight in volume of total solution;

Ammonium citrate: about 8 percent by weight in volume of total solution;

Ammonium dihydrogen phosphate: about 20 percent by weight in volume of total solution;

and De-ionized water.

The electrolyte solution provided a high rate of removal, good planarization, and a smooth wafer surface. The electrolyte solution had a pH greater than about 3.0.

Example 2

A copper plated wafer was polished using the following electrolyte solution within a modified cell on an Electra® Cu Integrated ECP system, available from Applied Materials, Inc. of Santa Clara, Calif.

BTA: about 0.4 percent by weight in volume of total solution;

Ammonium citrate: about 8 percent by weight in volume of total solution;

Diammonium hydrogen phosphate: about 20 percent by weight in volume of total solution;

and De-ionized water.

The electrolyte solution provided a high rate of removal, good planarization, and a smooth wafer surface. The electrolyte solution had a pH greater than about 3.0.

Example 3

A copper plated wafer was polished using the following electrolyte solution within a modified cell on an Electra® Cu Integrated ECP system, available from Applied Materials, Inc. of Santa Clara, Calif.

BTA: about 0.4 percent by weight in volume of total solution;

Ethylenediamine (EDA): about 8 percent by weight in volume of total solution;

Phosphoric acid: about 20 percent by weight in volume of total solution;

KOH: about 3 percent by weight in volume of total solution;

and De-ionized water.

The electrolyte solution provided a high rate of removal, good planarization, and a smooth wafer surface. The electrolyte solution had a pH greater than about 4.0.

While foregoing is directed to various embodiments of the invention, other and further embodiments of the invention may be devised without departing from the basic scope thereof, and the scope thereof is determined by the claims that follow.

What is claimed is:

1. A method for planarizing a surface of a wafer, comprising polishing the wafer in an electrolyte composition comprising a phosphate system having a pH from about 3 to about 10, wherein the wafer is connected to an electrical power source, and wherein the phosphate system comprises ammonium dihydrogen phosphate, diammonium hydrogen phosphate, or a mixture thereof.

2. The method of claim 1, wherein the electrolyte composition comprises about 2 to about 30 percent by weight of ammonium dihydrogen phosphate in volume of total solution.

3. The method of claim 1, wherein the electrolyte composition comprises about 2 to about 30 percent by weight of diammonium hydrogen phosphate in volume of total solution.

4. A method for planarizing a surface of a wafer, comprising polishing the wafer in an electrolyte composition comprising a phosphate system having a pH from about 3 to about 10, wherein the wafer is connected to an electrical power source, and wherein the electrolyte composition further comprises one or more additives selected from the group consisting of benzotriazole, ammonium citrate, citric acid, and ammonia.

5. The method of claim 4, wherein the electrolyte composition further comprises one or more additives selected from the group consisting of tetraethylenepentamine, triethylenetetramine, diethylenetriamine, ethlylenediamine, amino acids, ammonium oxalate, and ammonium succinate.

6. The method of claim 5, wherein the electrolyte composition comprises about 0.01 to about 2 percent by weight of benzotriazole in volume of total solution and about 2 to about 15 percent by weight of ethylenediamine in volume of total solution.

7. The method of claim 4, wherein the electrolyte composition comprises about 0.01 to about 2 percent by weight of benzotriazole in volume of total solution.

8. The method of claim 4, wherein the electrolyte composition comprises about 2 to about 15 percent of ammonium citrate by weight in volume of total solution.

9. A method for planarizing a surface of a wafer, comprising:

connecting the wafer to a positive terminal of an electrical power source;

disposing the wafer in an electrolyte composition comprising ammonium dihydrogen phosphate, diammonium hydrogen phosphate, or a mixture thereof; and removing materials from the surface of the wafer disposed in the electrolyte composition.

10. The method of claim 9, wherein the electrolyte composition has a pH greater than about 3 and less than about 10.

11. The method of claim 9, wherein the electrolyte composition comprises about 2 to about 30 percent by weight of ammonium dihydrogen phosphate in volume of total solution.

12. The method of claim 9, wherein the electrolyte composition comprises about 2 to about 30 percent by weight of diammonium hydrogen phosphate in volume of total solution.

13. The method of claim 9, wherein the electrolyte composition further comprises one or more additives selected from the group consisting of benzotriazole, ammonium citrate, ethlylenediamine, tetraethylenepentamine, triethylenetetramine, diethylenetriamine, amino acids, ammonium oxalate, ammonia, ammonium succinate, and citric acid.

14. The method of claim 13, wherein the electrolyte composition comprises about 0.01 to about 2 percent of benzotriazole by weight in volume of total solution and about 2 to about 15 percent of ammonium citrate by weight in volume of total solution.

15. The method of claim 13, wherein the electrolyte composition comprises about 0.1 percent of benzotriazole and about 8 percent by weight of ammonium citrate by weight in volume of total solution.

16. The method of claim 13, wherein the electrolyte composition comprises about 0.01 to about 2 percent by weight of benzotriazole in volume of total solution and about 2 to about 15 percent by weight of ethylenediamine in volume of total solution.

17. A method for planarizing a surface of a wafer, comprising:

connecting the wafer to a positive terminal of an electrical power source;

disposing the water in an electrolyte composition comprising ammonium dihydrogen phosphate, benzotriazole, and ethylenediamine; and removing materials from the surface of the wafer disposed in the electrolyte composition.

18. The method of claim 17, wherein the electrolyte composition comprises about 2 to about 30 percent by weight of ammonium dihydrogen phosphate in volume of total solution.

19. The method of claim 17, wherein the electrolyte composition further comprises about 2 to about 30 percent by weight of diammonium hydrogen phosphate in volume of total solution.

20. The method of claim 17, wherein the electrolyte composition comprises about 0.01 to about 2 percent of benzotriazole by weight in volume of total solution and about 2 to about 15 percent of ethylenediamine by weight in volume of total solution.

21. The method of claim 17, wherein the electrolyte composition has a pH greater than about 3 and less than about 10.

22. The method of claim 17, wherein the removed materials comprise copper.

23. A method for electrochemically polishing a substrate, comprising:

providing a substrate having metal atoms disposed on a surface thereof;

disposing the wafer in an electrolyte composition comprising ammonium dihydrogen phosphate, diammonium hydrogen phosphate, or a mixture thereof;

flowing the electrolyte composition through an ion exchange resin to remove the metal ions from the solution; and recycling the electrolyte solution to the substrate.

24. The method of claim 23, wherein the electrolyte composition comprises about 2 to about 30 percent by weight of ammonium dihydrogen phosphate in volume of total solution.

25. The method of claim 23, wherein the electrolyte composition comprises about 2 to about 30 percent by weight of diammonium hydrogen phosphate in volume of total solution.

26. The method of claim 23, wherein the electrolyte composition has a pH greater than about 3 and less than about 10.

27. The method of claim 23, wherein the electrolyte composition further comprises one or more additives selected from the group consisting of benzotriazole, ammonium citrate, ethlylenediamine, tetraethylenepentamine, triethylenetetramine, diethylenetriamine, amino acids, ammonium oxalate, ammonia, ammonium succinate, and citric acid.

28. The method of claim 27, wherein the electrolyte composition comprises about 0.01 to about 2 percent of benzotriazole by weight in volume of total solution and about 2 to about 15 percent of ammonium citrate by weight in volume of total solution.

29. The method of claim 27, wherein the electrolyte composition comprises about 0.01 to about 2 percent of benzotriazole by weight in volume of total solution and about 2 to about 15 percent of ethylenediamine by weight in volume of total solution.

30. The method of claim 23, wherein the ion exchange resin comprises a chelating agent to remove dissolved metal ions from the electrolyte solution.

31. The method of claim 30, wherein metal ions comprise copper.

32. An electrolyte composition comprising about 2 to about 23 percent by weight of ammonium dihydrogen phosphate, diammonium hydrogen phosphate, or a mixture thereof in volume of total solution and one or more additives selected from the group consisting of benzotriazole, ammonium citrate, ethylenediamine, tetraethylenepentamine, triethylenetetramine, diethylenetriamine, amino acids, ammonium oxalate, ammonia, ammonium succinate, and citric acid.

33. The electrolyte composition of claim 32, wherein the electrolyte composition comprises about 0.01 to about 0.5 percent of benzotriazole by weight in volume of total solution and about 2 to about 15 percent of ammonium citrate by weight in volume of total solution.

34. The composition of claim 38 wherein the electrolyte composition comprises about 0.01 to about 2 percent of benzotriazole by weight in volume of total solution and about 2 to about 15 percent of ethylenediamine by weight in volume of total solution.

35. A method for planarizing a surface of a wafer, comprising polishing the wafer in an electrolyte composition comprising ammonium dihydrogen phosphate, diammonium hydrogen phosphate, or a mixture thereof, wherein the wafer is connected to an electrical power source.

36. A method for planarizing a surface of a wafer, comprising:

connecting the wafer to a positive terminal of an electrical power source;

disposing the wafer in an electrolyte composition comprising ammonium dihydrogen phosphate, diammonium hydrogen phosphate, or a mixture thereof; and removing materials from the surface of the wafer disposed in the electrolyte composition.

37. The method of claim 36, wherein the electrolyte composition comprises one or more additives selected from the group consisting of benzotriazole, ammonium citrate, ethylenediamine, tetraethylenepentamine, triethylenetetramine, diethylenetriamine, amino acids, ammonium oxalate, ammonia, ammonium succinate, and citric acid.

* * * * *

UNITED STATES PATENT AND TRADEMARK OFFICE
CERTIFICATE OF CORRECTION

| | |
|---|---|
| PATENT NO. | : 6,899,804 B2 |
| APPLICATION NO. | : 10/032275 |
| DATED | : May 31, 2005 |
| INVENTOR(S) | : Alain Duboust et al. |

It is certified that error appears in the above-identified patent and that said Letters Patent is hereby corrected as shown below:

On Title Page, Col. 1

Item [30], Foreign Application Priority Data: Please delete the foreign application priority data.

Title Page, Col. 2
Item [57], Abstract, Line 10: Change "ethlylenediamine" to --ethylenediamine--

Column 2, Line 13: Change "continously" to --continuously--

Column 2, Line 29: Change "ethlylenediamine" to --ethylenediamine--

Column 2, Line 41: Change "ethlylenediamine" to --ethylenediamine--

Column 2, Line 65: Change "an" to --a--

Column 3, Line 58: Change "shinny" to --shiny--

Column 3, Line 66: Change "ethlylenediamine" to --ethylenediamine--

Column 4, Line 26: After "Applied", insert --Materials--

Column 7, Line 21: Insert a comma after "tetraethylenepentamine"

Column 7, Line 22: Change "ethlylenediamine" to --ethylenediamine--

Column 8, Claim 5, Line 51: Change "ethlylenediamine" to --ethylenediamine--

Column 9, Claim 13, Line 19: Change "ethlylenediamine" to --ethylenediamine--

Column 9, Claim 17, Line 41: Change "water" to --wafer--

Column 10, Claim 27, Line 21: Change "ethlylenediamine" to --ethylenediamine--

Column 10, Claim 32, Line 45: Change "ethlylenediamine" to --ethylenediamine--

Column 10, Claim 34, Line 54: Change "38" to --32--

UNITED STATES PATENT AND TRADEMARK OFFICE
CERTIFICATE OF CORRECTION

PATENT NO. : 6,899,804 B2
APPLICATION NO. : 10/032275
DATED : May 31, 2005
INVENTOR(S) : Alain Duboust et al.

It is certified that error appears in the above-identified patent and that said Letters Patent is hereby corrected as shown below:

Column 12, Claim 37, Line 2: Change "ethlylenediamine" to --ethylenediamine--

Signed and Sealed this

Twenty-eighth Day of November, 2006

JON W. DUDAS
*Director of the United States Patent and Trademark Office*